(12) United States Patent
Peron

(10) Patent No.: US 7,084,692 B2
(45) Date of Patent: Aug. 1, 2006

(54) CONTROL OF A THYRISTOR OF A RECTIFYING BRIDGE

(75) Inventor: Benoît Peron, Tours (FR)

(73) Assignee: STMicroelectronics S.A., Montrouge (FR)

(*) Notice: Subject to any disclaimer, the term of this patent is extended or adjusted under 35 U.S.C. 154(b) by 0 days.

(21) Appl. No.: 10/603,220

(22) Filed: Jun. 25, 2003

(65) Prior Publication Data

US 2004/0090260 A1 May 13, 2004

(30) Foreign Application Priority Data

Jun. 28, 2002 (FR) .............................. 02 08116

(51) Int. Cl.
*H03K 5/08* (2006.01)

(52) U.S. Cl. .................... 327/322; 327/323; 327/442
(58) Field of Classification Search ................ 327/322, 327/323, 440, 442, 447; 363/27, 28, 54–58, 363/85, 96, 128, 135–137
See application file for complete search history.

(56) References Cited

U.S. PATENT DOCUMENTS 3,767,998 A  10/1973  Beling
5,675,640 A * 10/1997  Tappert et al. ......... 379/374.01
6,054,891 A *  4/2000  Christiansen ............... 327/438

OTHER PUBLICATIONS

Patent Abstracts of Japan, vol. 015, No. 121 (E–1049), Mar. 25, 1991 & JP 03 010416 A (NEC Corp.).

* cited by examiner

*Primary Examiner*—Kenneth B. Wells
(74) *Attorney, Agent, or Firm*—Lisa K. Jorgenson; James H. Morris; Wolf, Greenfield & Sacks, P.C.

(57) ABSTRACT

A method and a circuit for controlling at least one thyristor constitutive of a rectifying bridge with a filtered output, including closing the thyristor when the voltage thereacross becomes greater than zero, and making the gate current of the thyristor disappear when the current therein exceeds its latching current.

58 Claims, 4 Drawing Sheets

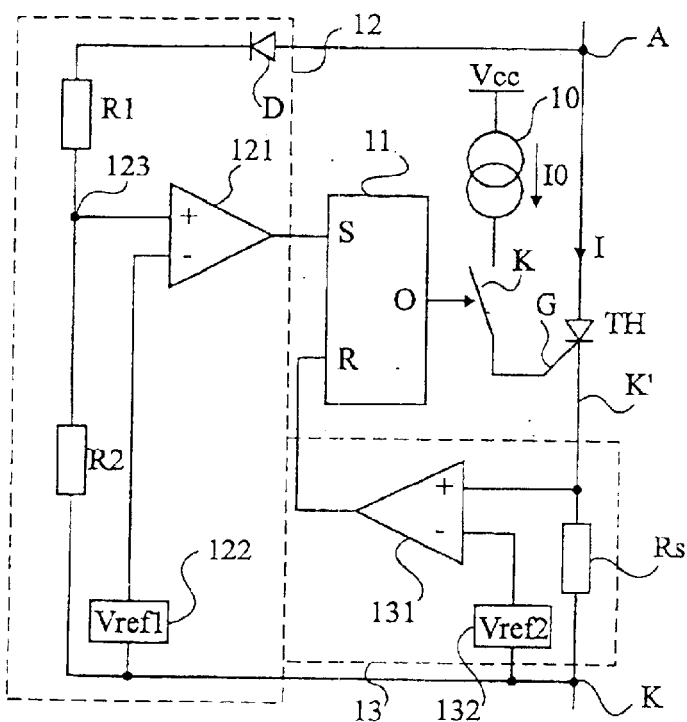
Fig 4
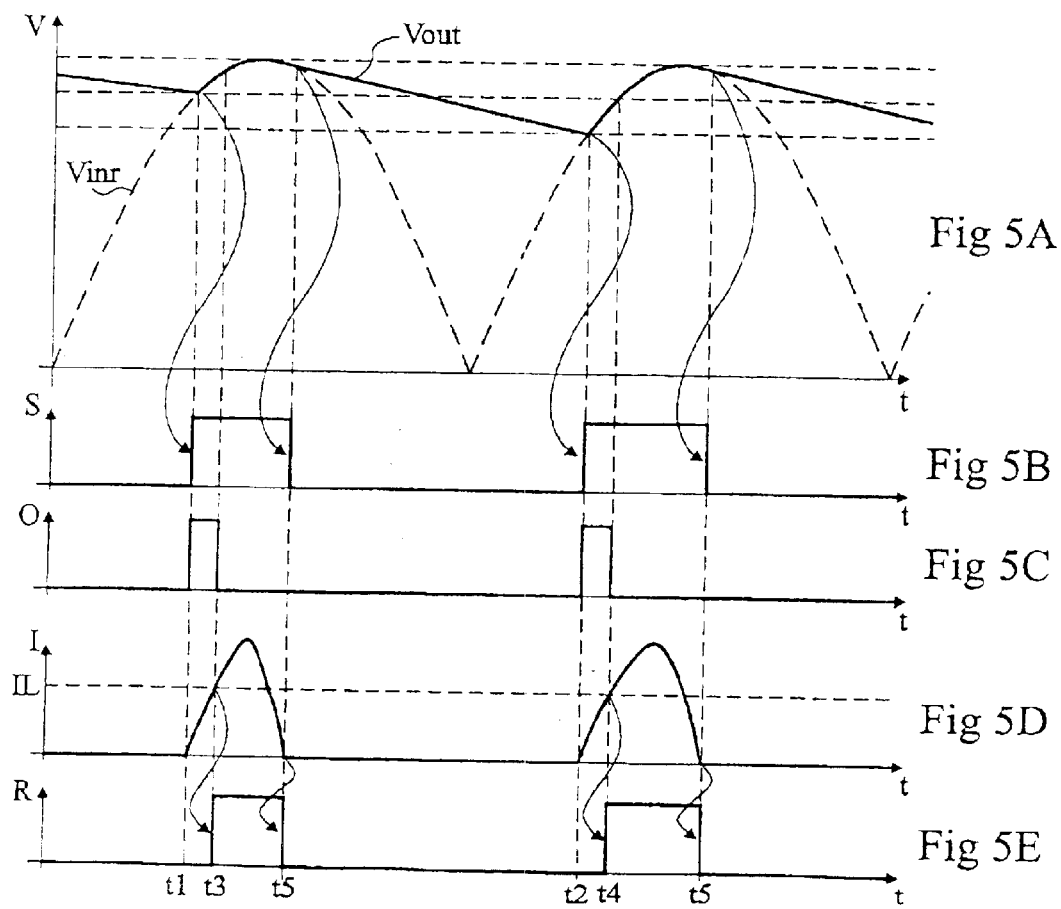
Fig 5A
Fig 5B
Fig 5C
Fig 5D
Fig 5E

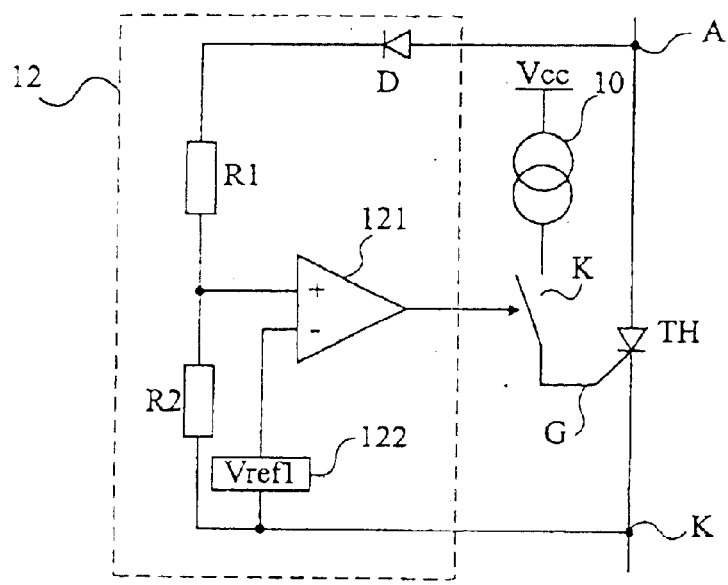
Fig 6
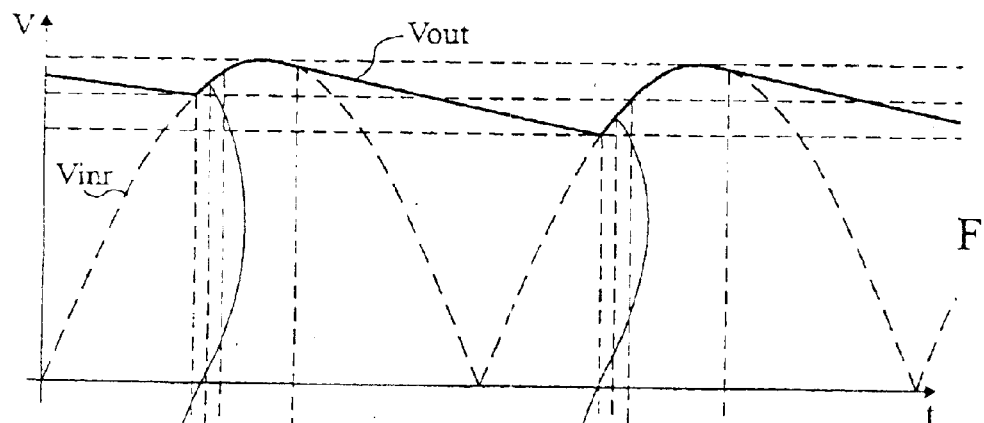
Fig 7A
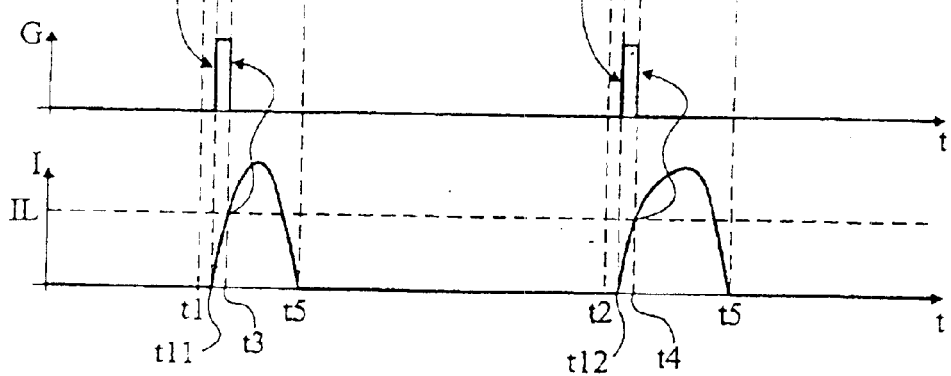
Fig 7B
Fig 7C

CONTROL OF A THYRISTOR OF A RECTIFYING BRIDGE

BACKGROUND OF THE INVENTION

1. Field of the Invention

The present invention relates to the control of a thyristor used in a rectifying bridge. The present invention more specifically relates to thyristors used in rectifying bridges with a filtered output, that is, where the need for turning on the thyristor is not synchronous with the zero crossings of the A.C. supply voltage of the bridge.

2. Discussion of the Related Art

FIG. 1 shows the electric diagram of a composite fullwave rectifying bridge of the type to which the present invention applies. More generally, the present invention applies to any filtered rectifying bridge, whatever the number of exploited phases of the A.C. input signal.

Composite bridge 1 of FIG. 1 is formed of two thyristors TH1 and TH2 and of two diodes D1 and D2 connected in two parallel branches of the bridge between two respective positive and reference output terminals 2 and 3. Terminals 2 and 3 are intended to provide the rectified voltage which is filtered by means of a capacitor C to provide a filtered D.C. supply voltage Vout to a load 4 (Q). Two input terminals 5 and 6 of bridge 1 receive an A.C. voltage Vin. Terminals 5 and 6 are connected to the respective interconnection points of the series connections of the thyristors and diodes, respectively TH1-D1 and TH2-D2.

Thyristors TH1 and TH2 are controlled by a circuit 7 (CTRL) providing the signals adapted to turning on the thyristors when A.C. input voltage Vin exceeds output voltage Vout, to cause the recharge of capacitor C.

FIG. 2 illustrates, in a timing diagram, the operation of a composite bridge such as illustrated in FIG. 1 with a control of thyristors TH1 and TH2 by a constant current. In other words, in this example, control circuit 7 provides a constant current to the respective gates G1 and G2 of thyristors TH1 and TH2.

In FIG. 2, output voltage Vout has been shown in full line while rectified A.C. input voltage Vin (unfiltered) has been represented by a dotted line designated as Vinr. As is known, voltage Vout follows the course of voltage Vinr only during on periods of the rectifying bridge to recharge capacitor C. Between these periods, capacitor C discharges into load 4, which decreases voltage Vout.

In the first halfwave illustrated in FIG. 2, a turning-on of the thyristors at a time t1 is assumed. Only one of thyristors TH1 or TH2 conducts and recharges the capacitor until the middle of the halfwave. The second halfwave illustrated in FIG. 2 assumes a variation in the current surged by the load. In this example, an increase of the load is assumed, causing a decrease of voltage Vout faster than before the first halfwave. In this case, time t2 of conduction of the bridge thyristors is advanced with respect to what this conduction time (t1') would have been with no modification of the load. In the second halfwave, the conducting thyristor is not the same as in the first halfwave. However, this changes nothing with respect to the operating principles.

The example of FIG. 2 illustrates a control posing no synchronization problem since, as soon as the voltage across one of the thyristors becomes positive, said thyristor closes instantaneously, with no current peak problem (high di/dt) at the closing.

However, according to the type of thyristor used to form the bridge, other problems are encountered.

If sensitive thyristors are used, that is, thyristors only requiring a small gate current (a few tens of microamperes), to minimize losses linked to the supply of the gate current, a parasitic triggering problem appears since this type of thyristor has a poor immunity against voltage variations thereacross.

To avoid this untimely triggering, less sensitive thyristors may be chosen. However, the losses are then high since the thyristor requires a gate current on the order of a few tens of milliamperes to be made conductive. Such a gate current generates a strong reverse current and losses of a few watts to be compared with the some ten milliwatts of low-sensitivity thyristors.

In practice, a compromise must be made between the gate current necessary to trigger the thyristors and the immunity against voltage variations thereacross.

FIG. 3 illustrates, in a timing diagram, a second conventional example of control of thyristors of a composite bridge. In this case, the control is a pulse control. Control circuit 7 provides, permanently, a pulse train (illustrated in FIG. 3) having a pulsewidth provided to ensure a sufficient conduction (a current greater than the thyristor latching current) before the pulse disappears. Referring to the example of FIG. 2, that is, in a first halfwave of rectified A.C. voltage Vinr where a crossing of curves Vout and Vinr occurs again at a time t1, the triggering (closing of thyristor TH1 or TH2) is not necessarily instantaneous. In the example shown, time t1 is subsequent to a pulse and the beginning of the next current pulse Imp1 must thus be awaited to trigger the thyristor closing. As in FIG. 2, the second halfwave of curve Vinr illustrates the case of an increase in the load supplied by the rectifying bridge. Here again, pulse Imp2 triggering the closing of one of the thyristors may be subsequent to time t2. The maximum interval between the time when curves Vout and Vinr cross and the thyristor closing is conditioned by the pulse frequency.

Such a pulse train control enables using low-sensitivity thyristors, that is, thyristors requiring high gate currents while limiting reverse losses due to the absence of a constant current supplying the gates.

However, a major disadvantage of this solution is that it generates harmonic disturbances resulting from the current peaks occurring due to the interval between times t1 and t2 and the beginning of pulses Imp1 and Imp2. The current peaks generate electromagnetic disturbances incompatible with some applications. To reduce electromagnetic disturbances, a solution would consist of increasing the pulse frequency. However, this then increases losses since the current becomes closer and closer to a constant gate current.

SUMMARY OF THE INVENTION

The present invention aims at controlling the closing of thyristors of a rectifying bridge with a filtered output which overcomes the disadvantages of known solutions. In particular, the present invention aims at enabling use of sensitive thyristors, without this resulting in high losses, nor in electromagnetic disturbances due to current peaks.

The present invention also aims at providing a control circuit that reduces the current consumption for the closing of the thyristors of a controllable rectifying bridge.

The present invention also aims at providing a solution particularly well adapted to the control of a composite rectifying bridge.

To achieve these and other objects, the present invention provides a method for controlling at least one thyristor constitutive of a rectifying bridge with a filtered output, comprising:

closing the thyristor when the voltage thereacross becomes greater than zero; and making the gate current of the thyristor disappear when the current therein exceeds its latching current.

According to an embodiment of the present invention, the voltage across the thyristor is measured by a unidirectional resistive rectifying bridge.

According to an embodiment of the present invention, the latching current in the thyristor is detected by measuring the voltage thereacross.

The present invention also provides a circuit for controlling at least one thyristor constitutive of a rectifying bridge with a filtered output, comprising:

a first comparator for controlling a circuit providing a gate current to the thyristor, said comparator detecting that the voltage across the thyristor becomes positive; and an element for inhibiting the gate current circuit as soon as the thyristor conducts a current greater than its latching current.

According to an embodiment of the present invention, said first comparator comprises a first input which receives the midpoint of a resistive dividing bridge having its terminals connected, via a diode, to the thyristor terminals, and a second input which receives a first reference voltage.

According to an embodiment of the present invention, said first comparator is formed of a first bipolar transistor, the base-emitter voltage drop of which conditions said first reference voltage.

According to an embodiment of the present invention, the gate current circuit is formed of a constant current source controlled by a switch connected to the thyristor gate.

According to an embodiment of the present invention, the gate current circuit comprises a second bipolar transistor having its base connected to the collector of the first transistor, the emitter of the second transistor being connected to a terminal of application of a D.C. supply voltage via a resistor and its base being connected to this D.C. supply voltage by two diodes in series.

According to an embodiment of the present invention, the circuit also comprises:

a second comparator having an input receiving a voltage proportional to the current in the thyristor and a second input receiving a second reference voltage; and a flip-flop, the respective set and reset inputs of which receive the outputs of the first and second comparators, and the output of which is connected to a switch for providing a gate current to the thyristor.

According to an embodiment of the present invention, the circuit controls several thyristors.

The present invention also provides a controllable rectifying bridge.

The foregoing objects, features, and advantages of the present invention, will be discussed in detail in the following non-limiting description of specific embodiments in connection with the accompanying drawings.

BRIEF DESCRIPTION OF THE DRAWINGS

FIG. 4 shows, in the form of blocks, a first embodiment of a circuit for controlling a thyristor according to the present invention;

FIGS. 5A, 5B, 5C, 5D, and 5E illustrate in the form of timing diagrams the operation of the control circuit of FIG. 4;

FIG. 6 schematically shows in the form of blocks a second embodiment of a thyristor control circuit according to the present invention;

FIGS. 7A, 7B, 7C illustrate, in the form of timing diagrams, the operation of the circuit of FIG. 6;

DETAILED DESCRIPTION

Figure 1:
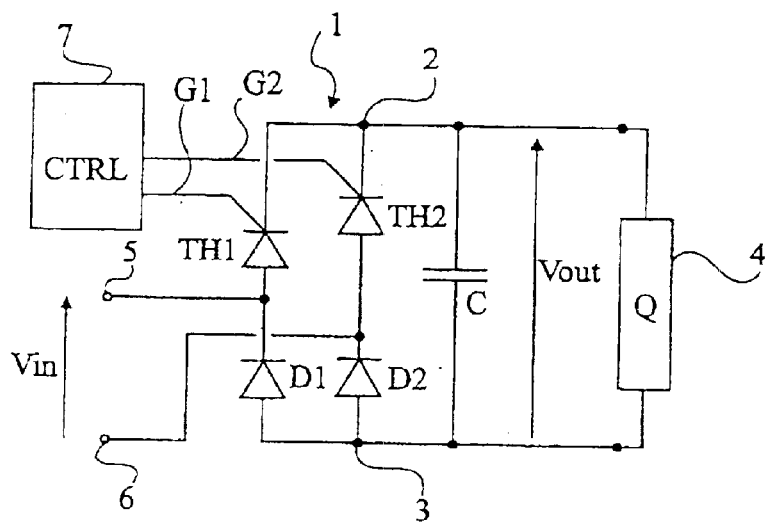
FIG. 1, previously described, shows the electric diagram of a composite bridge with a filtered output to which the present invention applies as an example.

The same elements have been designated with the same references in the different drawings. For clarity, the timing diagrams are not to scale. Further, only those circuit elements which are necessary to the understanding of the present invention have been shown in the drawings and will be described hereafter. In particular, the load supplied by a rectifying bridge according to the present invention has not been described in detail. The present invention applies to any load type, provided that it is supplied by means of the filtered output (for example, filtered by a capacitor) of a rectifying element comprising a thyristor controlled according to the present invention.

A feature of the present invention is to cause the turning-on of the thyristor constitutive of a rectifying bridge with a filtered output, when the voltage across the thyristor becomes positive, and to make the gate current of the thyristor disappear when the current flowing therethrough exceeds a value chosen to be greater than its latching current, that is, greater than the current value from which the thyristor remains on even in case of a disappearing of the gate current.

FIG. 4 shows a first embodiment of a control circuit according to the present invention. In FIG. 4, a single thyristor TH has been shown between terminals A and K to be compared, in the circuit of FIG. 1, with terminals 5 and 2 or with terminals 6 and 2. This thyristor thus is, for example, any one of thyristors TH1 or TH2 of a composite rectifying bridge such as that in FIG. 1. More generally, thyristor TH belongs to a rectifying bridge with a filtered output having any structure.

According to the present invention, gate G of thyristor TH is connected, via a switch K, to a current source 10. Source 10 provides a constant current 10.

According to the embodiment of FIG. 4, switch K is controlled by an RS-type flip-flop 11, the output (O) of which is connected to a control terminal of switch K and inputs S and R of which are respectively connected to the outputs of voltage and current detectors 12 and 13. Voltage detector 12 has the function of measuring voltage VAK across thyristor TH and of detecting the 0 crossing of this voltage towards positive values. Current detector 13 aims at measuring the current in thyristor TH in the on state, to detect a current greater than the thyristor latching current.

In the example of FIG. 4, detector 12 is formed of a comparator 121, an inverting input of which receives a reference voltage 122 (Vref1) and a non-inverting input of which is connected to midpoint 123 of a resistive dividing bridge formed of two resistors R1 and R2 between terminals A and K of the thyristor. To only detect the voltage crossing towards positive values and thus make the resistive bridge unidirectional, a diode D connects terminal A to a first terminal of resistor R1, the other terminal of which is connected to midpoint 123. The output of comparator 121 is connected to the set terminal (S) of flip-flop 11.

Current detector 13 is formed of a comparator 131, an inverting input of which receives a reference voltage 132 (Vref2) and a non-inverting input of which is connected to a first terminal of a current-to-voltage conversion resistor Rs, connected between cathode K' of thyristor TH and terminal K. The non-inverting input of comparator 131 is thus connected to electrode K' of thyristor TH. The output of comparator 131 is connected to reset terminal R of flip-flop 11.

The operation of the circuit of FIG. 4 will be discussed hereafter in relation with FIGS. 5A to 5E which shows, in the form of timing diagrams, examples of shapes characteristic of circuit signals.

Figure 2:
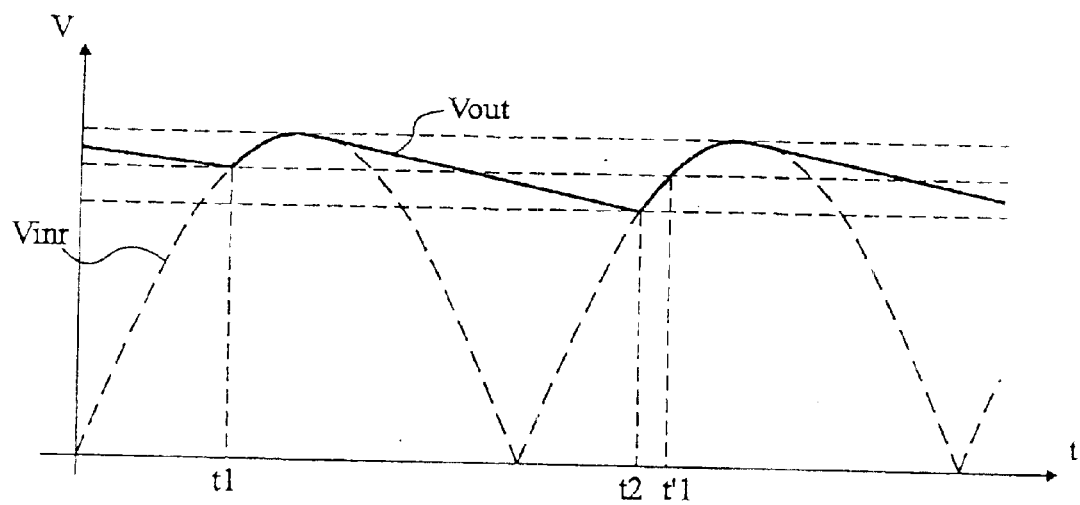
FIG. 2, previously described, illustrates a first conventional example of control of a composite bridge.
Figure 3:
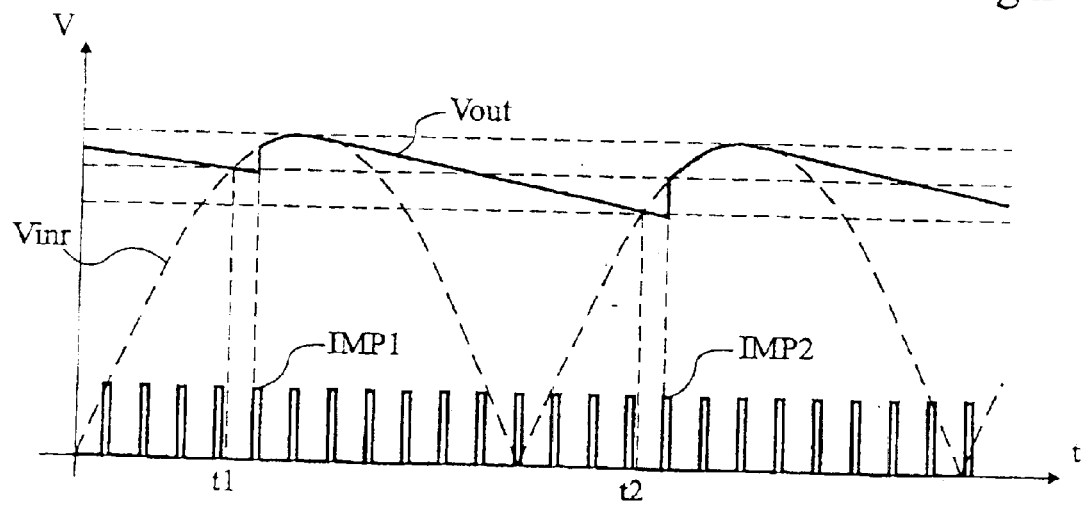
FIG. 3, previously described, illustrates a second conventional example of control of a composite bridge.

FIG. 5A shows an example of shape of output voltage Vout of a filtered rectifying bridge comprising thyristors controlled by the circuit of FIG. 4 in load conditions similar to those illustrated in previously-described FIGS. 2 and 3. FIG. 5B illustrates the shape of the state signal of the set terminal (S) of flip-flop 11. FIG. 5C illustrates the shape of output signal O of flip-flop 11, and thus of turn-on control of supply switch K of gate G of thyristor TH. FIG. 5D illustrates the shape of current I in thyristor TH. FIG. 5E illustrates the shape of the reset state signal (R) of flip-flop 11.

In FIG. 5A, the shape of an unfiltered rectified A.C. voltage Vinr has been shown as in FIGS. 2 and 3. Voltage Vout shown in FIG. 5A corresponds to voltage Vout of FIG. 1 of a composite rectifying bridge. Accordingly, the two successive halfwaves shown in FIG. 5A actually correspond to conductions of respective thyristors TH1 and TH2. However, to simplify, the operation will be discussed in relation with thyristor TH of FIG. 4, it being understood that this operation occurs one halfwave out of two for each of thyristors TH1 or TH2.

As soon as voltage Vout becomes smaller than voltage Vinr, this actually means that voltage VAK across the thyristor of the concerned branch of the bridge becomes positive. In FIGS. 5A to 5E, the possible positive circuit triggering threshold with respect to the zero conditioned by voltage reference Vref1 of comparator 121 of FIG. 4 is neglected. Thus, as soon as the voltage across the thyristor becomes positive (time t1), the signal provided by comparator 121 switches state and provides a high state to input S of flip-flop 11 (FIG. 5B). Since the thyristor is, at this time, off, no current is detected by detector 13 (reset input R of flip-flop 11 is low). Accordingly, output O (FIG. 5C) of the flip-flop provides a high state conditioning the turning-on of switch K.

This turning-on of switch K causes the triggering of thyristor TH by the flowing of a gate current provided by current source 10. As soon as current I running through thyristor TH (FIG. 5D) becomes greater than the threshold set by voltage reference Vref2, the output of comparator 131 switches and provides a high state at the reset input (FIG. 5E) of flip-flop 11 (time t3). This state switching resets output signal O of flip-flop 11 and accordingly turns off switch K.

The triggering threshold of the current detector is chosen according to the latching current (IL) of thyristor TH, to ensure that its control is cut off once its current has reached the latching current of the thyristor.

Since the thyristor is triggered, independently from its gate control, it will remain on as long as it conducts a direct current, that is, as long as the voltage thereacross remains positive. In the application to a filtered rectifying bridge, this means that the thyristor remains on until rectified A.C. voltage Vinr falls back under voltage Vout stored by the capacitor (time t5), that is, after the passing at the top of halfwave Vinr (in fact, when the current flowing through thyristor TH becomes smaller than its hold current IH). At time t5, the blocking of thyristor TH causes the switching to the low state of the output of comparator 131, since the voltage across the thyristor is no longer positive (in reality, greater than voltage Vref2, taking dividing bridge R1-R2 into account).

In the second halfwave illustrated in FIGS. 5A to 5E, the same examples as in previously-described FIGS. 2 and 3 have been shown, that is, an increase in the load supplied by the rectifying bridge resulting in a faster decrease in voltage Vout. Accordingly, the time (t2) when the voltage across the thyristor becomes zero is advanced with respect to time t1 of the previous halfwave. From the viewpoint of the control circuit of FIG. 4, this changes nothing, that is, the switching of the output state of flip-flop 11 is advanced, which simply generates a longer conduction period of thyristor TH (FIG. 5D). The disappearing of the current in thyristor TH occurs, as for the first case, from the time when voltage Vinr falls back under voltage Vout stored by the output voltage filtering capacitor (not shown).

The disappearing of a high state at input S (FIG. 5B) of flip-flop 11 only occurs at a time t5 where thyristor TH turns off for lack of current flowing therethrough (in fact, a current smaller than the hold current). Time t5 thus is independent from the supplied load conditions. This has however no effect on the thyristor gate current since the disappearing of the high state on signal R (FIG. 5E) also occurs at time t5, preventing the state on input S from having an effect.

An advantage of the present invention is that it enables determining the best moment to inject a control current into the thyristor gate. Indeed, by measuring the voltage thereacross, current peaks at the turning-on of this thyristor are avoided. Accordingly, harmonic disturbances are eliminated.

Another advantage of the present invention is that by eliminating its control current from as soon as it is on, reverse current leakages and the control circuit consumption are reduced.

Another advantage of the present invention is that it enables controlling low-sensitivity thyristors with little current (set by current source 10). Indeed, since the thyristor triggering is detected by means of detector 13, the necessary control current is reduced to a minimum.

According to an alternative embodiment not shown, comparator 121 (or flip-flop 11) may be used to apply an external control signal (for example, a start-up signal). For example, input S of the flip-flop may receive a logic combination (for example, by an AND gate) of the output of comparator 121 and of an external start-up logic signal.

FIG. 6 shows a second embodiment of a control circuit according to the present invention. This embodiment takes advantage of the functional features of the controlled thyristor(s) TH. It shows voltage detector 12, switch K and current source 10 for supplying gate G of the thyristor. The main difference with respect to the diagram of FIG. 4 is the elimination of current detector 13. Said detector is replaced with a judicious choice of reference voltage Vref1, taking advantage of a memory effect intrinsic to thyristor TH due to its latching current IL.

According to this embodiment, threshold voltage Vref1 is chosen to be greater than R2*VT(R2+R1), where VT represents the threshold voltage of thyristor TH at the considered operating point (VT, IT), that is, voltage VAK from which it can become conductive when its gate receives a control current IT.

In such a configuration, as soon as voltage VAK across thyristor TH exceeds value (R1+R2)Vref1/R2, comparator 121 turns on switch K and current I0 is injected into the thyristor gate.

As soon as latching current IL is reached in thyristor TH, voltage VAK thereacross collapses, which causes a new switching of the output of comparator 121 and the turning-off of switch K.

As compared to the diagram of FIG. 4, that of FIG. 6 has the advantage of avoiding the presence of a series current-to-voltage resistor Rs for current detector 13 as well as the presence of RS flip-flop 11.

The operation of the embodiment of FIG. 6 is illustrated in FIGS. 7A to 7C which respectively show the shapes of output voltage Vout, of gate current G, and of current I in thyristor TH in the conductive state. As for the previous timing diagrams, the shape of unfiltered rectified voltage Vinr has been illustrated in dotted lines in FIG. 7A, and two successive halfwaves representing two supplied load conditions have been shown.

In the first halfwave of voltage Vinr, when at time t1 voltage Vout becomes smaller than voltage Vinr, voltage VAK across thyristor TH becomes positive. Due to the chosen threshold Vref1, the output of comparator 121 switches not immediately, but with a slight delay (time t1). This switching turns on switch K and causes the flowing of a current through gate G (FIG. 7B). A current thus starts flowing through thyristor TH (FIG. 7C). When current I reaches latching current IL of the thyristor, voltage VAK thereacross decreases, which causes the reverse switching (time t3) of the output of comparator 121 and, accordingly, the turning-off of switch K and the disappearing of the thyristor gate current. This operation is linked to the choice of threshold Vref1 according to voltage VT, so that the triggering threshold of comparator 121 is greater than voltage VT. Thus, as soon as latching current IL is reached, the output of comparator 121 switches again.

A similar operation is repeated in the second halfwave (times t2, t12, and t4). It can be seen that the closing duration of switch K is adapted to the load condition, in that if the closing is advanced due to an increase in the load supplied by the circuit, its opening time is also advanced. Its conduction time (and thus the duration of application of a gate current) is thus reduced to what is strictly necessary, by automatically adapting to the supplied load.

The delay (time t1 to t11 and t2 to t12) at the thyristor turning-on must be as short as possible to avoid occurrence of prejudicial current peaks. Fulfilling this condition poses no problem in practice.

Figure 8:
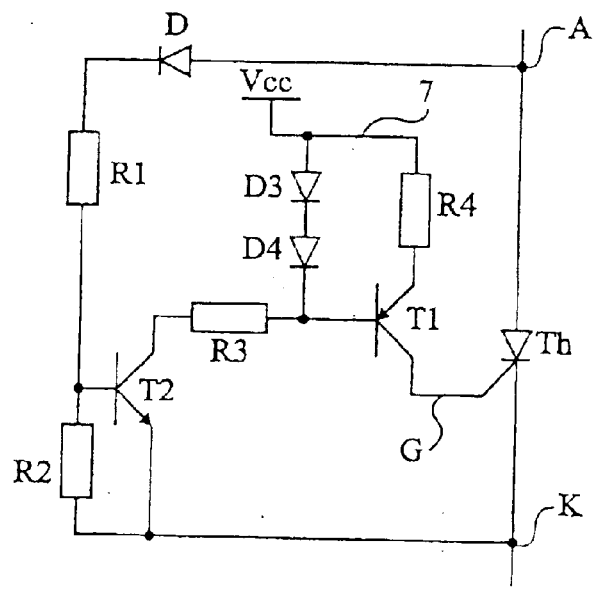
FIG. 8 shows the electric diagram of an example of practical forming of the control circuit of FIG. 6.

FIG. 8 shows a third embodiment of a circuit for controlling a thyristor TH according to the present invention. This drawing shows the same characteristics as in FIG. 6 and details an example of practical forming of its circuit. The current generator (source 10) is here formed of a PNP-type bipolar transistor T1 having its emitter connected, by a resistor R4, to a terminal 7 of application of a D.C. supply voltage Vcc, and its base connected by two diodes in series D3 and D4 to terminal 7, the anodes of diodes D3 and D4 being directed towards terminal 7. The collector of transistor T1 is connected to gate G of thyristor TH. The base of transistor T1 is connected, by a resistor R3, to the collector of a second NPN-type bipolar transistor T2 performing the function of comparator 121. The base of transistor T2 is connected to the junction point of resistors R1 and R2. The emitter of transistor T2 is connected to terminal K (cathode of thyristor TH).

Resistor R3 has the function of biasing diodes D2 and D3 and of limiting the current in transistor T2. The value I0 of the current provided by source 10 is equal to the voltage drop in a forward-biased diode divided by resistance R4. One of the two diodes D3 and D4 is used to compensate for the base/emitter voltage of transistor T1.

Voltage VAK across thyristor TH for which a current is injected in its gate is provided by relation (R1+R2)*VBEN/R2+VD, where VBEN represents the base-emitter voltage drop of transistor T2 (of type NPN) in the on state.

Considering a practical example of a thyristor having an on-state forward voltage VT of at most approximately 1.3 volts, and assuming equal resistances R1 and R2 and a voltage drop in forward-biased diode D on the order of 0.7 volt, the base-emitter voltage to which transistor T2 is submitted when thyristor TH conducts is on the order of 0.3volt. Accordingly, when the thyristor conducts, transistor T2 is off (insufficient base-emitter voltage) and no current flows through the thyristor gate.

Figure 9:
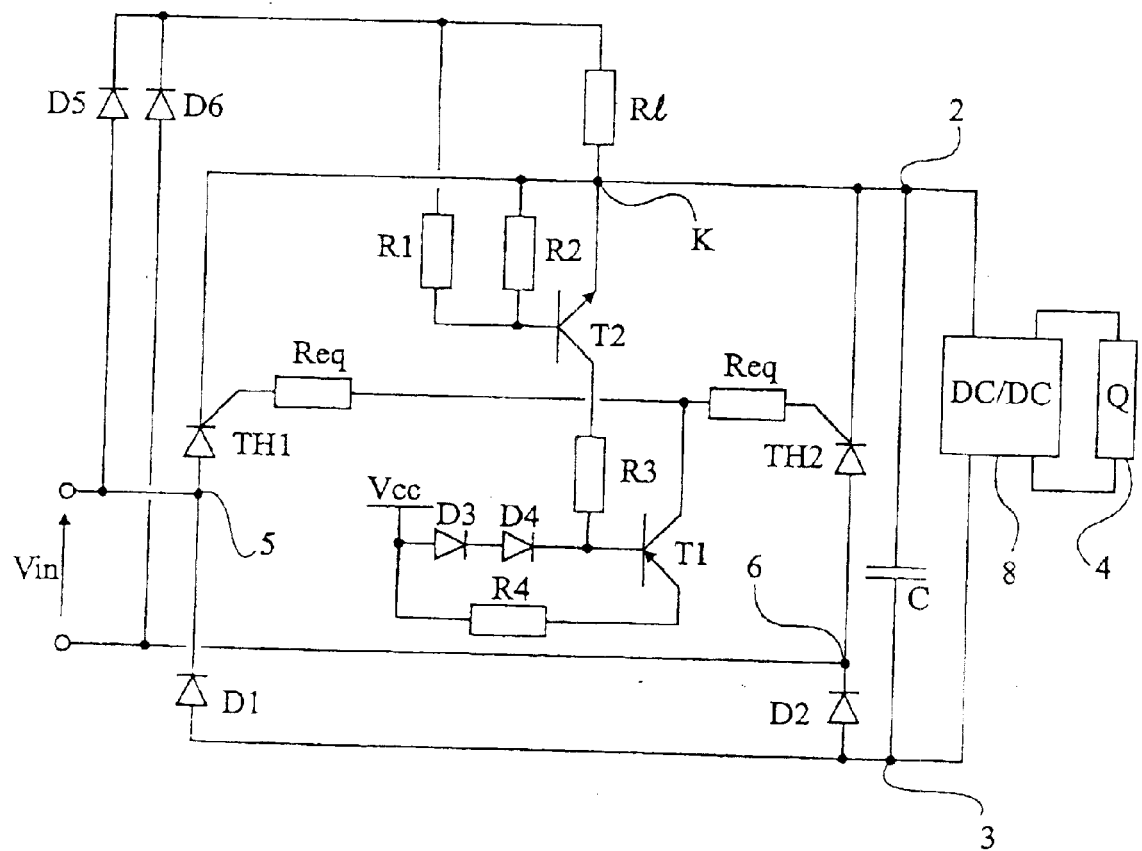
FIG. 9 shows an example of application of the present invention to a fullwave composite rectifying bridge.

FIG. 9 shows an example of application of the control circuit according to the present invention (in its embodiment of FIG. 8) to a rectifying bridge adapted to limiting the surge current at the circuit power-on.

The rectifying bridge is, as in FIG. 1, formed of two thyristors TH1 and TH2 and of two diodes D1 and D2. Terminal 2, to which are directly connected the cathodes of thyristors TH1 and TH2, is connected by a first terminal of a surge current limiting resistor R1. The second terminal of resistor R1 is connected to terminals 5 and 6 of application of voltage Vin via two rectifying diodes D5 and D6. Thyristors TH1 and TH2 are used to short-circuit resistor R1 once a starting phase of the circuit is over. In this starting phase, the (initial) charge of capacitor C is performed through a bridge formed of diodes D1, D2, D5, and D6. In the example of FIG. 9, the rectifying bridge supplies a D.C./D.C. converter 8, to the output terminals of which is connected a load 4 (Q).

According to the present invention, a circuit of the type shown in FIG. 8 is used to control both transistors TH1 and TH2. The emitter of transistor T2 is connected to cathodes K of thyristors TH1 and TH2. Dividing bridge R1-R2 is placed between the cathodes of diodes D5 and D6 and common terminal K of thyristors TH1 and TH2. Diodes D5 and D6 then each play the role of input diode D of dividing bridge R1, R2, according to the halfwave of A.C. input voltage Vin. Balancing resistors Req are placed between the respective gates of thyristors TH1 and TH2 and the collector of transistor T1. The function of these resistors is to balance the gate currents of thyristors TH1 and TH2, due to possible technological dispersions influencing the gate-cathode voltage.

The operation of the surge current limiting circuit of FIG. 9 can be deduced from the operations discussed in relation with the above drawings.

An advantage of the present invention is that it enables using low-sensitivity thyristors, thus exhibiting a strong immunity against static voltage variations, with a very low average control current, without generating additional losses linked to the reverse leakage current.

Of course, the present invention is likely to have various alterations, modifications, and improvements which will readily occur to those skilled in the art. In particular, the sizing of the voltage thresholds and of the resistors will be chosen according to the characteristics of the thyristors used. Further, although the present invention has been described hereabove in relation with a fullwave composite bridge, it may be implemented in any rectifying structure using at least one thyristor. Further, the present invention may apply to a composite bridge in which the respective positions of the diodes and thyristors are opposite with respect to the bridges of FIGS. 1 and 9. Adapting the control circuit is within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for controlling at least one thyristor constitutive of a rectifying bridge with a filtered output, comprising:
    closing the thyristor when the voltage thereacross becomes greater than zero; and
    making the gate current of the thyristor disappear when the current therein exceeds its latching current.

2. The method of claim 1, wherein the voltage across the thyristor is measured by a unidirectional resistive rectifying bridge.

3. The method of claim 1, wherein the latching current in the thyristor is detected by measuring the voltage thereacross.

4. A circuit for controlling at least one thyristor constitutive of a rectifying bridge with a filtered output, comprising:
    a first comparator for controlling a circuit providing a gate current to the thyristor, said comparator detecting that the voltage across the thyristor becomes positive; and
    an element for inhibiting the gate current circuit as soon as a current in the thyristor is greater than its latching current.

5. The circuit of claim 4, wherein said first comparator comprises a first input which receives the midpoint of a resistive dividing bridge having its terminals connected, via a diode, to the terminals of the thyristor, and a second input which receives a first reference voltage.

6. The circuit of claim 4, wherein said first comparator comprises a first bipolar transistor, the base-emitter voltage drop of which conditions a first reference voltage.

7. The circuit of claim 4, wherein the gate current circuit is formed of a constant current source controlled by a switch connected to the gate of the thyristor.

8. The circuit of claim 7, wherein said first comparator comprises a first bipolar transistor, the base-emitter voltage drop of which conditions a first reference voltage, and wherein the gate current circuit comprises a second bipolar transistor having its base connected to the collector of the first transistor, the emitter of the second transistor being connected to a terminal of application of a D.C. supply voltage via a resistor and its base being connected to this D.C. supply voltage by two diodes in series.

9. The circuit of claim 5, comprising:
    a second comparator having an input receiving a voltage proportional to the current in the thyristor and a second input receiving a second reference voltage; and
    a flip-flop, the respective set and reset inputs of which receive the outputs of the first and second comparators, and the output of which is connected to a switch for providing a gate current to the thyristor.

10. The control circuit of claim 5, controlling several thyristors.

11. A controllable rectifying bridge comprising at least one thyristor, comprising the control circuit of claim 5.

12. A circuit for controlling at least one thyristor of a rectifying bridge, the circuit comprising:
    an element for inhibiting a gate current of the thyristor in response to a current in the thyristor exceeding a latching current of the thyristor.

13. The circuit of claim 12, wherein the element for inhibiting a gate current of the thyristor comprises a switch.

14. The circuit of claim 12, further comprising:
    a current detector configured to detect the current in the thyristor.

15. The circuit of claim 14, wherein the current detector has an input configured to receive the current in the thyristor and an output configured to produce a signal to control the element configured to inhibit a gate current of the thyristor.

16. The circuit of claim 14, wherein the current detector comprises:
    a comparator having a non-inverting input configured to receive a voltage proportional to the current in the thyristor.

17. The circuit of claim 16, wherein the comparator has an inverting input configured to receive a reference voltage.

18. The circuit of claim 16, wherein the comparator has an output configured to produce a control signal to control the element configured to inhibit a gate current of the thyristor.

19. The circuit of claim 12, further comprising:
    a voltage detector configured to detect a voltage across the thyristor.

20. The circuit of claim 19, wherein the voltage detector comprises a unidirectional resistive rectifying bridge.

21. The circuit of claim 19, further comprising:
    a flip-flop configured to receive an output from the voltage detector and to send a control signal to the element configured to inhibit a gate current of the thyristor.

22. The circuit of claim 21, further comprising:
    a current detector configured to detect the current in the thyristor.

23. The circuit of claim 22, wherein the current detector is configured to send a reset signal to the flip-flop.

24. The circuit of claim 19, wherein the voltage detector comprises:
    a transistor having a base terminal configured to receive a signal proportional to the voltage across the thyristor.

25. The circuit of claim 24, wherein the voltage detector further comprises:
    a resistive bridge; and
    wherein the signal proportional to the voltage across the thyristor corresponds to a signal at a midpoint of the resistive bridge.

26. The circuit of claim 24, wherein the transistor further comprises an emitter terminal connected to a cathode of the thyristor.

27. The circuit of claim 24, further comprising:
    a resistor; and
    wherein the transistor has a collector terminal connected via the resistor to the element configured to inhibit a gate current of the thyristor.

28. The circuit of claim 19, wherein the voltage detector comprises:

a comparator configured to produce a control signal to control the element configured to inhibit a gate current of the thyristor.

29. The circuit of claim 28, wherein the comparator comprises an input configured to receive a signal proportional to the voltage across the thyristor.

30. The circuit of claim 29, wherein the voltage detector further comprises:

a resistive bridge; and wherein the signal proportional to the voltage across the thyristor corresponds to a signal at a midpoint of the resistive bridge.

31. The circuit of claim 28, wherein the comparator has an input configured to receive a reference voltage.

32. The circuit of claim 31, wherein the reference voltage exceeds a value of a threshold voltage of the thyristor multiplied by a constant factor.

33. The circuit of claim 32, wherein the constant factor depends upon a value of a resistor of a resistive bridge.

34. The circuit of claim 12, further comprising:

a current generator for generating the gate current.

35. The circuit of claim 34, wherein the current generator comprises a voltage source connected to a resistor.

36. The circuit of claim 34, wherein the current generator comprises:

a transistor; and a voltage source;

wherein a first terminal of the transistor is configured to receive a voltage signal from the voltage source.

37. The circuit of claim 36, wherein the first terminal of the transistor is an emitter terminal of the transistor.

38. The circuit of claim 36, wherein a second terminal of the transistor is connected to the element configured to inhibit a gate current of the thyristor.

39. The circuit of claim 38, wherein the second terminal is a collector terminal of the transistor.

40. The circuit of claim 36, wherein the current generator further comprises a diode connected between the voltage source and a second terminal of the transistor.

41. The circuit of claim 40, wherein the second terminal of the transistor is a base terminal of the transistor.

42. A method of controlling at least one thyristor of a rectifying bridge, the method comprising:

inhibiting a gate current of the thyristor in response to a current in the thyristor exceeding a latching current of the thyristor.

43. The method of claim 42, wherein inhibiting a gate current of the thyristor comprises resetting a flip-flop.

44. The method of claim 42, further comprising:

generating the gate current of the thyristor prior to inhibiting the gate current.

45. The method of claim 42, further comprising:

detecting a current in the thyristor.

46. The method of claim 45, wherein the latching current is detected by measuring a voltage across the thyristor.

47. The method of claim 42, further comprising:

closing the thyristor in response to a voltage across the thyristor exceeding a threshold voltage.

48. The method of claim 47, further comprising:

detecting a voltage across the thyristor.

49. The method of claim 48, wherein the detection of a voltage across the thyristor is performed using a unidirectional resistive rectifying bridge.

50. The method of claim 47, wherein closing the thyristor comprises setting a flip-flop.

51. The method of claim 47, further comprising:

subsequent to closing the thyristor, allowing the current in the thyristor to flow if the current in the thyristor exceeds a holding current of the thyristor.

52. The method of claim 47, wherein the threshold voltage is approximately zero.

53. The method of claim 47, wherein the threshold voltage is proportional to a value of a resistor of a resistive bridge.

54. The method of claim 53, wherein the threshold voltage is proportional to a sum of values of resistors of the resistive bridge.

55. A circuit for controlling at least one thyristor of a rectifying bridge, the circuit comprising:

a current generator for generating a gate current of the thyristor; and means for inhibiting the gate current in response to a current in the thyristor exceeding a latching current of the thyristor.

56. The circuit of claim 55, further comprising:

means for detecting the current in the thyristor.

57. The circuit of claim 55, further comprising:

means for detecting a voltage across the thyristor.

58. The circuit of claim 57, further comprising:

means for closing the thyristor if the voltage across the thyristor exceeds a threshold voltage.

* * * * *